United States Patent
Gong et al.

(10) Patent No.: US 8,624,761 B1
(45) Date of Patent: Jan. 7, 2014

(54) SERIALIZING PARALLEL DATA STREAMS

(75) Inventors: Datao Gong, Allen, TX (US); Tiankuan Liu, Dallas, TX (US); Jingbo Ye, Lewisville, TX (US)

(73) Assignee: Southern Methodist University, Dallas, TX (US)

( * ) Notice: Subject to any disclaimer, the term of this patent is extended or adjusted under 35 U.S.C. 154(b) by 511 days.

(21) Appl. No.: 12/768,556

(22) Filed: Apr. 27, 2010

(51) Int. Cl.
*H03M 9/00* (2006.01)

(52) U.S. Cl.
USPC ............ 341/101; 341/100; 375/316; 375/356

(58) Field of Classification Search
USPC .......................... 341/100, 101; 375/316, 356
See application file for complete search history.

(56) References Cited

U.S. PATENT DOCUMENTS

| | | | | |
|---|---|---|---|---|
| 3,992,703 A | * | 11/1976 | Luisi et al. ................... | 365/190 |
| 5,798,720 A | * | 8/1998 | Yano ............................ | 341/101 |
| 5,945,862 A | * | 8/1999 | Donnelly et al. ............. | 327/278 |
| 5,982,309 A | * | 11/1999 | Xi et al. ........................ | 341/101 |
| 6,710,726 B2 | * | 3/2004 | Kim et al. ..................... | 341/100 |
| 7,006,021 B1 | * | 2/2006 | Lombaard ..................... | 341/100 |
| 7,046,174 B1 | * | 5/2006 | Lui et al. ....................... | 341/101 |
| 7,109,756 B1 | * | 9/2006 | Zhang ............................ | 326/93 |
| 7,116,251 B1 | * | 10/2006 | Groen et al. .................. | 341/100 |
| 7,135,899 B1 | * | 11/2006 | Sancheti et al. .............. | 327/144 |
| 7,471,752 B2 | * | 12/2008 | Ge et al. ........................ | 375/354 |
| 7,551,107 B2 | * | 6/2009 | Shim et al. .................... | 341/101 |
| 2001/0007577 A1 | * | 7/2001 | Measor ......................... | 375/247 |
| 2006/0138543 A1 | * | 6/2006 | Fukuda ......................... | 257/352 |
| 2006/0165185 A1 | * | 7/2006 | Dally et al. ................... | 375/257 |

* cited by examiner

*Primary Examiner* — Linh Nguyen

(74) *Attorney, Agent, or Firm* — Fish & Richardson P.C.

(57) ABSTRACT

The present disclosure is directed to a system and method for serializing data streams. In some implementations, a device includes a sapphire substrate and an integrated circuit formed on the sapphire substrate. The integrated circuit is configured to receive a plurality of digital signals from a detector and successively multiplex the plurality of digital signals to generate a serialized signal with a data rate approximately 4 Gb/s or greater, the integrated circuit having a feature size of approximately 0.10 μm or greater.

18 Claims, 4 Drawing Sheets

SERIALIZING PARALLEL DATA STREAMS

TECHNICAL FIELD

This invention relates to transmitting digital data and, more particularly, to serializing parallel data streams.

BACKGROUND

Silicon on sapphire (SOS) is a hetero-epitaxial process for integrated circuit manufacturing that consists of a thin layer (e.g., thinner than 1.0 micrometers) of silicon grown on a sapphire ($Al_2O_3$) wafer. Circuits constructed in the silicon layer are isolated from each other. The sapphire substrate is an electrical insulator that prevents electrical cross-talk to nearby circuit elements. In some implementations, SOS can include complementary metal-oxide-semiconductor (CMOS) technologies. With the insulating sapphire substrate, the SOS CMOS technology may eliminate parasitic bipolar junction transistors in the bulk silicon substrate and hence removes the mechanism for latch-ups.

SUMMARY

The present disclosure is directed to a system and method for serializing data streams. In some implementations, a device includes a sapphire substrate and an integrated circuit formed on the sapphire substrate. The integrated circuit is configured to receive a plurality of digital signals from a detector and successively multiplex the plurality of digital signals to generate a serialized signal with a data rate approximately 4 Gb/s or greater, the integrated circuit having a feature size of approximately 0.10 µm or greater.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
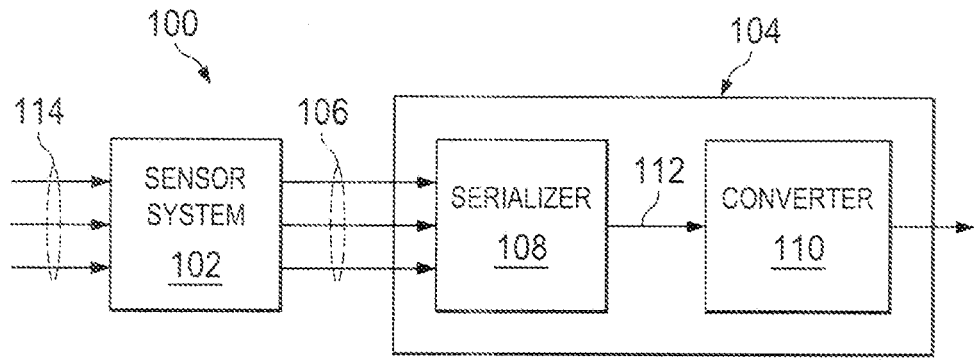
FIG. 1 is an example detection system for serializing signals from a detector.

FIG. 1 is a block diagram illustrating an example serializing system 100 for combining signals to form signals with high date rates. For example, the system 100 may be used to combine, aggregate or otherwise multiplex parallel signals into a signal with a data rate of about 4 to 5.8 Gigabits per second (Gb/s) or greater using relatively large transistors. The transistor size may be 0.10 micrometers (µm) or greater such as 0.13 µm or 0.25 µm. In some implementations, the system 100 may include complementary metal-oxide-semiconductor (CMOS) technology with a 0.25 µm feature size. In addition, the system 100 may include Silicon-on-Sapphire (SOS) such as 0.25 µm SOS CMOS technology. In some implementations, the system 100 may execute one or more of the following: receive a plurality of digital signals encoding information associated with the detected radiation; successively multiplex pairs of the digital signal to produce a single serialized signal encoding information from the original digital signal at high data rates such as about 5 Gb/s or greater; convert the serialized signal to an optical signal for transmission to downstream processors; and/or others. By using relatively large feature size for high data rates, the system 100 may reduce perturbations in the signals caused by the environment.

At a high level, the system 100 includes a conversion element 104 connected to channels 106. The channels 106 pass parallel digital signals to the conversion element 104. The parallel digital signals may be transmitted through the channels 106 using any suitable device. In the present illustration, a sensor system 102 is coupled to the conversion element 104 through the channels 106. The sensor system 102 is merely for illustration purpose only and the conversion element 104 may be coupled to other devices that produce parallel digital signals without departing from the scope of the disclosure. The conversion element 104 includes a serializer 108 that serializes signals and a converter 110 for converting digital signals to optical signals. In terms of a high level description of operation, the sensor system 102 detects radiation 114 and generates a plurality of digital signals encoding the detected information. The sensor system 102 transmits the digital signals to the serializer 108 through the channels 106. The serializer 108 combines, multiplexes or otherwise serializes the digital signals to a single data signal encoding the information from the received digital signals. The serializer 108 operates at a data rate of, for example, at least 5 Gb/s. The serializer 108 passes the serialized signal to the converter 110 through the connection 112. The converter 110 converts the digital signal to an optical signal and transmits the signal for downstream processing.

Turning to a more detailed description, the sensor system 102 includes hardware and may include software and/or firmware for detecting one or more properties of radiation 114. For example, the sensor system 102 may be a semiconductor particle detector that detects a path of subatomic particles. The one or more properties may include an energy, path, particle type, frequency, and/or other properties. In some implementations, the sensor system 102 may detect subatomic particles and/or electromagnetic waves. As for particles, the sensor system 102 may be a gaseous ionization detector, a solid-state detector, a calorimeter, and/or other type of device that detects particles and generates signals encoding the detected particles. As for electromagnetic waves, the sensor system 102 may be an optical detector, one or more photodiodes, photomultiplier, a charge-coupled device (CCD), and/or other device configured to detect electromagnetic waves and generate signals encoding the detected information. In some implementations, the sensor system 102 may include a plurality of sensors that spatially detects incident radiation 114 over a specified area. For example, the sensor system 102 may detect incident radiation 114 over one or more time periods and generate signals for different portions of an area for each time period. In these instances, the signals transmitted through the channels 106 may represent different spatial information for different portions of the sensor system 102 at a specified time period. By detecting spatial information over several time periods, the system 100 may determine the development of one or more properties of the incident radiation 114 such as a path of one or more particles. In some implementations, the channels 106 may transmit parallel data as low-voltage differential signals (LVDSs).

The conversion element 104 can include any software, hardware and/or firmware configured to receive multiple signals and generate an optical signal based on the received signals. For example, the conversion element 104 may receive multiple digital signals and generate a single optical signal encoding the information included in the multiple signals. As previously mentioned, the conversion element 104 includes a serializer 108 for multiplexing signals and a converter 110 for electrical-to-optical conversion. The serializer 108 can include any software, hardware and/or firmware that combines, aggregates or otherwise serializes signals into one or more signals. For example, the serializer 108 may serialize a plurality of received digital signals into a single signal having a high data rate. In some implementations, the serializer 108 can be an integrated circuit (IC or chip) that converts parallel data to serial data. In these instances, the serializer 108 may receive parallel data from the channels 106 and combine the parallel data into a single signal. The serializer 108 may include multiple interfaces in a single package. In general, the serializer 108 may facilitate the transmission of parallel data between two points over serial streams and reduce the number of data paths and, thus, the number of connecting PINS and/or wires. In some implementations, the serializer 108 may generate a single data stream that transmits data bit by bit. The serializer 108 may include one or more of the following elements: multiplexer (e.g., 2:1 multiplexer); phase-locked loop; d flip-flops; voltage controlled oscillator; sapphire substrate; CMOS technology; phase detector; and/or other elements.

In some implementations, the serializer 108 may based on a serialization circuit unit that utilizes a group of static D-flip-flop circuits in a cascade structure to achieve serialization with the power of 2. In these examples, the serializer 108 may include 2:1 multiplexing units to be reused before the last stage of multiplexing. As a result of including static logic, the serializer 108 may keep the power consumption low and make serialization robust. Working in the power of 2 may also simplify and speed up the divider chain in a phase locked loop (PLL) design. In the last 2:1 multiplexing unit in this example, which is the only stage that needs to operate at the full design speed of 5 Gb/s, the serializer 108 may include a pair of complementary CMOS clock signals to the d flip-flop. A differential voltage controlled oscillator (VCO) in the clock synthesizing unit may generate a pair of substantially matched clock signals. This type of serializer 108 may minimize, decrease, or otherwise reduce the mismatch in the clock signals to the D-flip-flop and, as a result, may improve the speed of the 2:1 multiplexer and of the serializer 108. In some implementations, the serializer 108 may include differential ring-oscillator PLL with dual loop path to generate the clock signals for all the multiplexing circuits.

In some implementations, the serializer 108 may include a sapphire substrate and/or other type of substrate to substantially prevent stray currents from spreading to nearby circuit elements. For example, the serializer 108 may consist of a thin layer (typically thinner than 0.6 µm) of silicon grown on a sapphire ($Al_2O_3$) wafer. In some implementations, the serializer 108 can be an application specific integrated circuit (ASIC) using, for example, a 0.25 µm SOS CMOS technology. In these instances, the serializer 108 can be configured for serial data transmission with a high data rate using relatively large transistors. For example, the serializer 108 may be a 16:1 serializer with at least 5 Gb/s serial data output. In some implementations, the serializer 108 may be an integrated circuit with feature sizes from about 0.10 µm or greater such as 0.13 or 0.25 µm.

The converter 110 can include any software, hardware, and/or firmware configured to convert the electrical signal received from channel 112 to an optical signal encoding the data. For example, the converter 110 may be the signal from the serializer 108 transmitted through the channel 112 to an optical signal suitable from multiplexing. In some implementations, the converter 110 converts the digital electrical signal from the serializer 108 to a digital optical signal and transmits the optical signal through a fiber optical cable.

In some aspects of operation, the sensor system 102 detects incident radiation 114 within a certain time period and generates signals for each of plurality of different areas on the sensor system 102. The sensor system 102 transmits, to the serializer 108, the signals as parallel data using the channels 106. The serializer 108 serializes the parallel data to a single signal and transmits the signal to the converter 110 using the channel 112. In some implementations, the serializer 108 executes multiple multiplexing steps to generate the serial signal. The converter 110 receives the serial signal and converts the electrical signal to an optical signal. The converter 110 transmits the optical signal through a fiber optical cable for downstream processing.

Figure 2A:
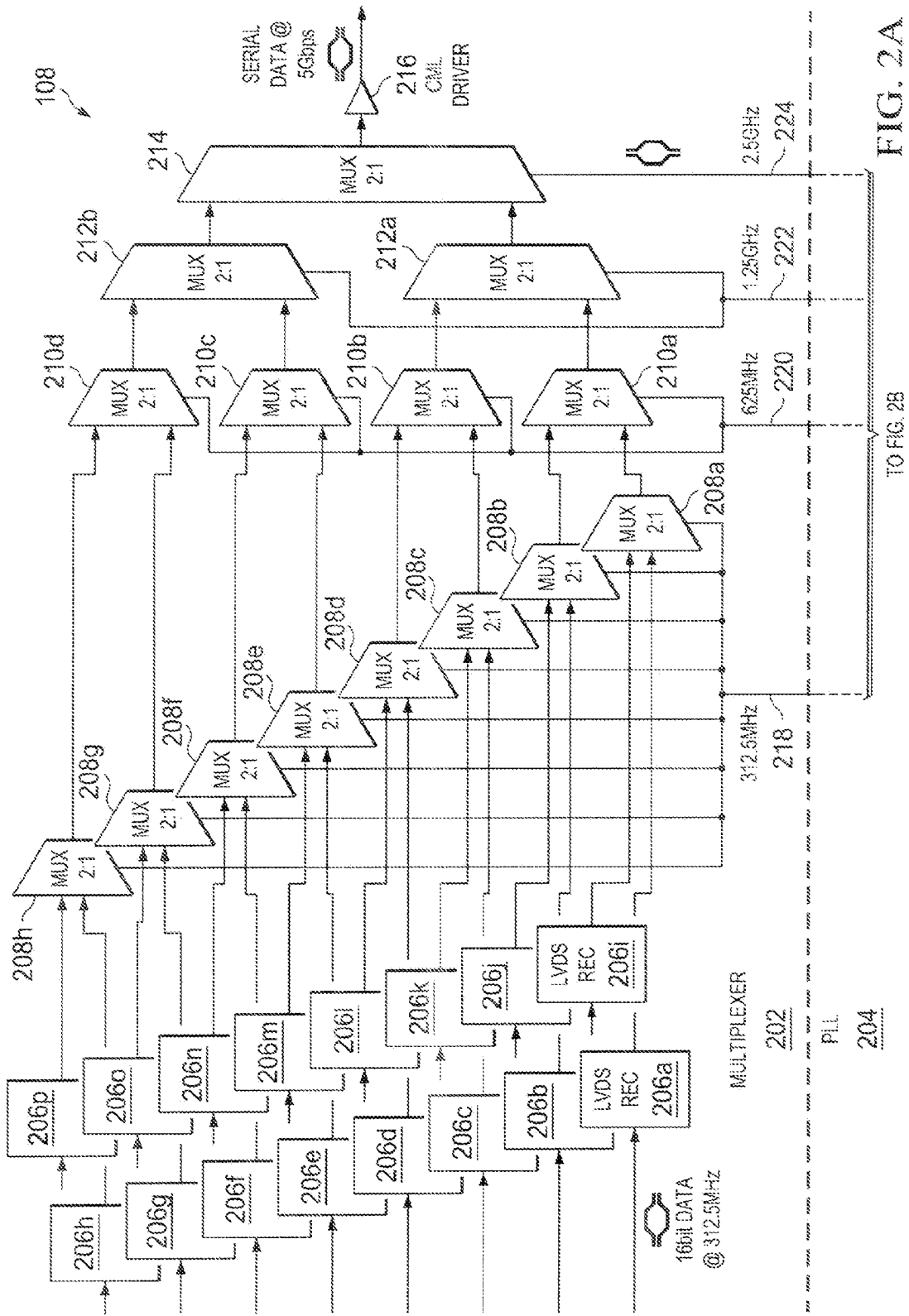
FIGS. 2A and 2B illustrate an example serializer of FIG. 1 in accordance with some implementations of the present disclosure.
Figure 2B:
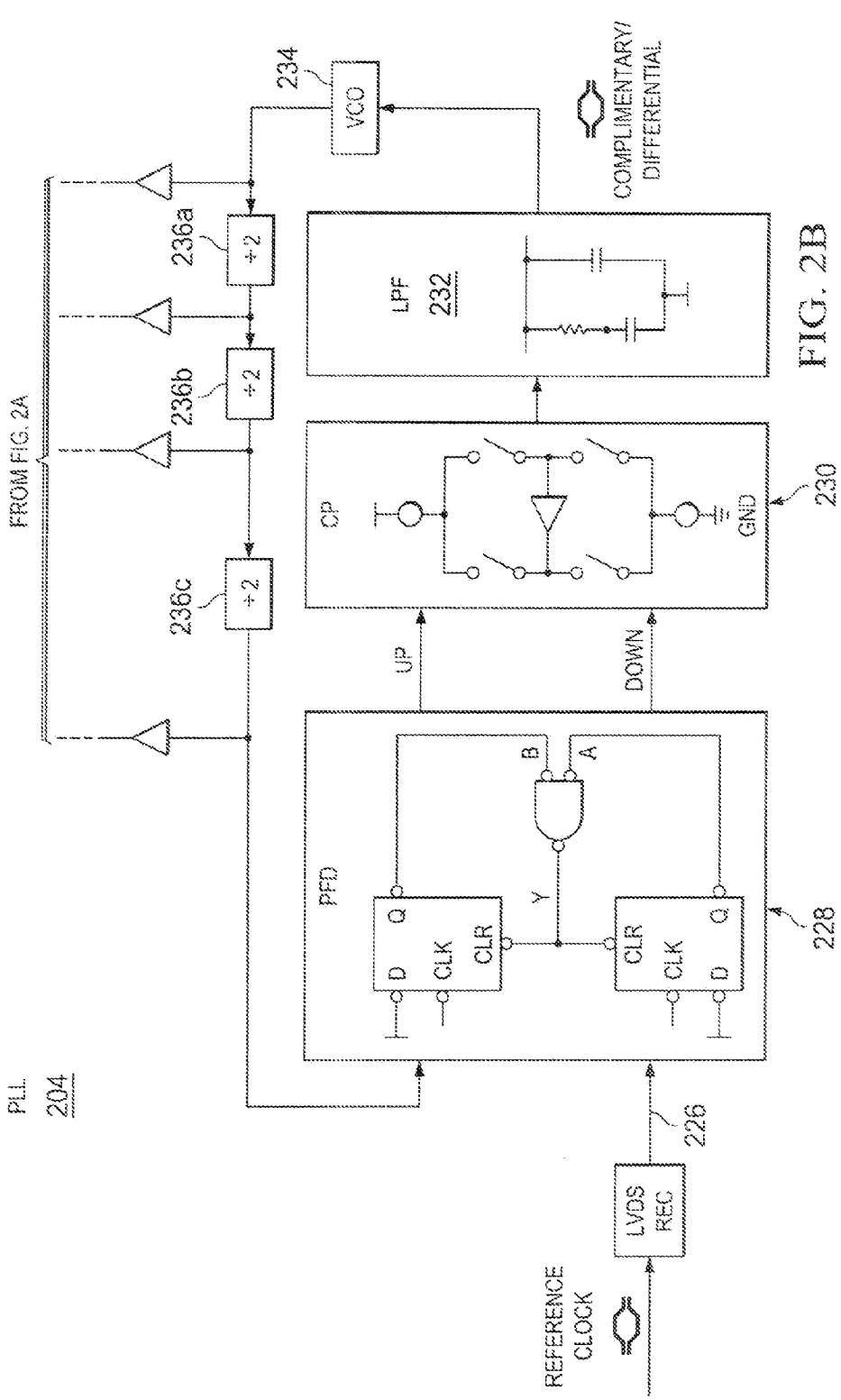

FIGS. 2A and 2B illustrate an example serializer 108 of FIG. 1 in accordance with some implementations of the present disclosure. In general, the illustrated serializer 108 receives digital parallel data and generates a serial signal based, at least in part, on the parallel data. In the illustrated implementation, the serializer 108 includes a multiplexer 202 for successively multiplexing pairs of digital signals to generate a serial signal and a phase-locked loop (PLL) 204 for generating clock signals for each multiplexing step. The multiplexer 202 includes a plurality of multiplexing levels that generate multiplexed signals having a data rate greater that the previous data rate. At the final stage, the multiplexer 202 generates a serial signal with a data rate about 5 Gb/s. The illustrated multiplexer includes 16 interfaces 206*a-p* for receiving low-voltage differential signaling (LVDS) signals, a first set of 2:1 multiplexers 208*a-h*, a second set of 2:1 multiplexers 210*a-d*, a third set of 2:1 multiplexers 212*a-b*, a final multiplexer 214 and a CML driver 216. Eight pairs of the 16 LVDS interfaces 206*a-p* are each connected to one multiplexer in the first set of multiplexers 208*a-h*. In addition, each multiplexer 208 receives the same first clock signal 218 and multiplexes the received pair in accordance with the clock signal 218. Pairs in the first set of multiplexers 208 pass the associated multiplexed signals to a single multiplexer in the second set of multiplexers 210*a-b*. In other words, each in the second set of multiplexers 210*a-b* receive two inputs from different pairs of multiplexers 208 in the first set. In addition, each multiplexer 210 receives the same first clock signal 220 and multiplexes the received pair in accordance with the clock signal 220. The two pairs of multiplexers 210 each pass their multiplexed signals to one multiplexer in the third set of multiplexers 212*a* and 212*b*. In other words, multiplexer 212*a* receives signals from multiplexers 210*a* and 210*b*, and multiplexer 212*b* receives signals from multiplexers 210*c* and 210*d*. In addition, each multiplexer 212 receives the same clock signal 222 and multiplexers the received pair in accordance with the clock signal 222. Multiplexers 212*a* and 212*b* pass their multiplexed signals to the final multiplexer 214. The final multiplexer 214 receives the clock signal 224 and splits the clock signal to two signals. In some implementations, the final multiplexer 214 introduces a phase shift in one of the two clock signals to substantially correct a phase discrepancy. The final multiplexer 214 multiplexes the two received signals in accordance with the phase-corrected clock signals to generate a serial signal with a data rate of approximately 5 Gb/s or greater.

The PLL 204 uses the reference signal 226 to phase lock with generated clock signals. In the illustrated implementation, the PLL 204 includes a phase frequency detector (PFD) 228, a charge pump (CP) 230, a low-pass filter (LPF) 232, a voltage controlled oscillator (VCO) 234, and frequency dividers 236a-c. The PFD 228 determines an error in phase between the reference signal 226 and the signal produced by the VCO 234. The amount of charge stored by the CP 230 is based, at least in part, on the difference in frequency or error between the two signals. The LPF 232 substantially attenuates signals with a frequency above a specified threshold. The CP 230 provides a voltage to the VCO 234 in accordance with the amount of stored charge. The VCO 234 generates an initial clock signal 224 for the multiplexer 202 based, at least in part, on the applied voltage. The clock signal 224 is passed to the final multiplexer 214 and a first frequency divider 236a. The frequency divider 236a generates the clock signal 222 with a frequency about half the clock signal 224 and passes the clock signal 222 to the multiplexers 212a-b and a second frequency divider 236b. The second frequency divider 236b generates a clock signal 220 with a frequency about half the clock signal 222 and passes the clock signal 220 to the multiplexers 210a-d and a third frequency divider 236c. The third frequency divider 236c generates a clock signal 218 with a frequency about half the clock signal 220 and passes the clock signal 218 to the multiplexers 208a-h and the PFD 228.

Figure 3:
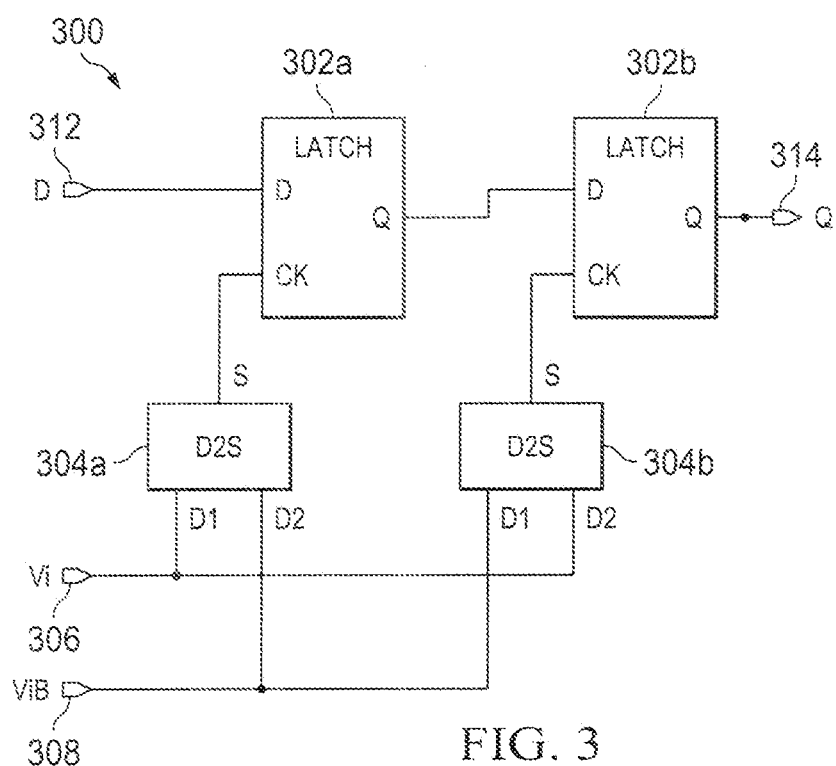
FIG. 3 illustrates an example d-flop of a multiplexer in accordance with some implementations of the present disclosure.

FIG. 3 illustrates an example d flip-flop 300 in accordance with some implementations of the present disclosure. In particular, the d flip-flop 300 substantially corrects a phase difference of a clock signal 306 and a complimentary clock signal 308. As previously mentioned, a multiplexer (e.g., MUX 214 of FIG. 2) may include a plurality of d flip-flops to aggregate or otherwise combine signals. For example, a 2:1 multiplexer may include two d flip-flops. In the illustrated implementation, the d flip-flop 300 includes two latches 302a and 302b and two differential-to-single converters (D2S) 304a and 304b. The latch 302a receives the data input 312 and stores the data for a period of time prior to passing the data to the latch 302b. Both the two D2S 304a and 304b receive the clock signal 306 and the complimentary clock signal 308. In the event that D1 is greater than D2, D2S 304a will output a logical 1 (e.g., 2.5 V) and D2S 304b will output a logical 0 (e.g., 0 V). In the event that D2 is greater than D1, D2S 304a will output a logical 0 (e.g., 0 V) and D2S 304b will output a logical 1 (e.g., 2.5 V). In doing so, D2S 304a and 304b may substantially eliminate or otherwise reduce a phase discrepancy between the initial clock signal 306 and the complimentary clock signal 308.

Figure 4:
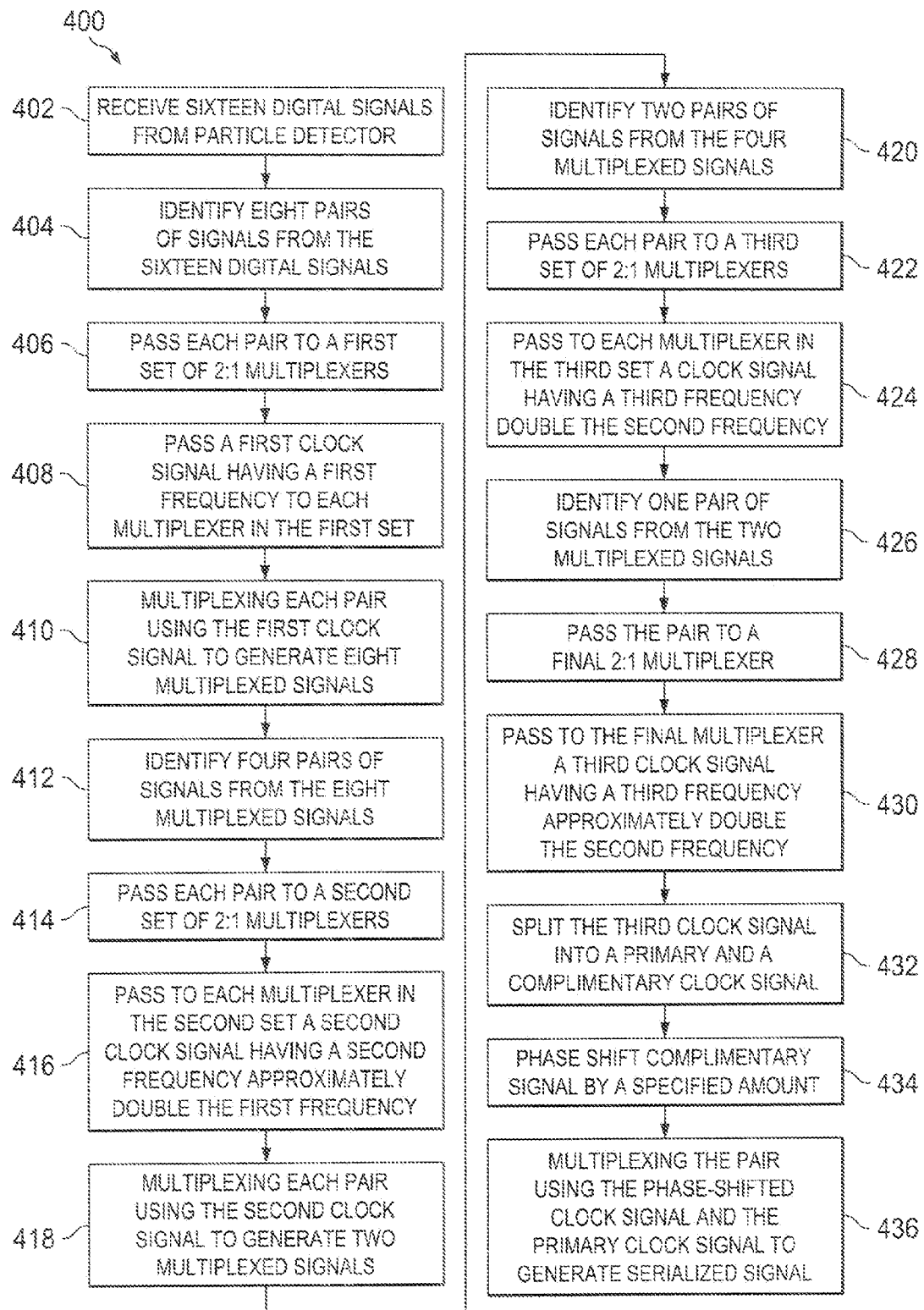
FIG. 4 is a flow chart illustrating an example method for serializing data into a single data stream with a high data rate.

FIG. 4 is a flow diagram illustrating an example method 400 for serializing digital signals in accordance with some implementations of the present disclosure. In particular, the method 400 includes introducing a phase shift in a final multiplexing step to reduce a mismatch in clock signals. Method 400 contemplates using any appropriate combination and arrangement of logical elements implementing some or all of the described functionality.

Method 400 begins at step 402 where 16 digital signals are received from a particle detector. For example, the multiplexer 202 of FIG. 2 may receive 16 digital signals from a detector. At step 404, eight pairs of signals are identified from the sixteen received signals. In the example, different pairs of interfaces of the multiplexer 202 may be wired to different multiplexers 208. Next, at step 406, each pair is passed to a first set of 2:1 multiplexers. A first clock signal having a first frequency is passed to each multiplexer in the first set at step 408. Again in the example, the first clock signal 218 may be passed from the PLL 204 to each of the multiplexers 208. At step 410, each pair is multiplexed using the first clock signal to generate eight multiplexed signals.

Next, at step 412, four pairs of the eight multiplexed signals are identified. As for the example, the output from different pairs of the multiplexers 208 are connected to a single multiplexer 210 such as the outputs of multiplexers 208g and 208h are connected to the multiplexer 210d. Each pair is passed to a second set of 2:1 multiplexers at step 414. Returning to the example, the initial multiplexed signals are passed to the multiplexers 210. At step 416, a second clock signal having a second frequency approximately double the first frequency is passed to each of the multiplexers in the second set. Again in the example, the second clock signal 220 is passed from the PLL 204 to each multiplexer 210. Next, at step 418, each pair of signals is multiplexed using the second clock signal to generate four multiplexed signals.

At step 420, two pairs of the four multiplexed signals are identified. As for the example, the output from different pairs of the multiplexers 210 are connected to third set of multiplexers 212 such as the outputs of multiplexer 210c and 210d are connected to the multiplexer 212b. Each pair is passed to a third set of 2:1 multiplexers at step 422. Returning to the example, the multiplexed signals are passed to the multiplexers 212. At step 422, a third clock signal having a third frequency approximately double the second frequency is passed to each of the multiplexers in the third set. Again in the example, the third clock signal 222 is passed from the PLL 204 to each multiplexer 212 at step 424.

At step 426, one pair of multiplexed signals are identified. As for the example, the output from different pairs of the multiplexers 212 are connected to a final multiplexer 214 such as the outputs of multiplexer 212a and 212b are connected to the multiplexer 214. Each pair is passed to a final 2:1 multiplexer at step 428. Returning to the example, the multiplexed signals are passed from multiplexer 212a and 212b to the multiplexers 214. At step 430, a fourth clock signal having a fourth frequency approximately double the third frequency is passed to the final multiplexer. Again in the example, the fourth clock signal 224 is passed from the PLL 204 to the final multiplexer 214. At step 432, the fourth clock signal is split into a primary and complementary clock signal. Next, at step 434, the complimentary clock signal is phase shifted to substantially correct mismatches between the primary and complimentary clock signal. The pair is, at step 436, multiplexed using the primary and phase-shifted clock signals to generate the serialized signal.

A number of embodiments of the invention have been described. Nevertheless, it will be understood that various modifications may be made without departing from the spirit and scope of the invention. Accordingly, other embodiments are within the scope of the following claims.

What is claimed is:

1. A method, comprising:
receiving a plurality of digital signals from a detector;
successively multiplexing the plurality of digital signals to generate a serialized signal with a data rate approximately 4 Gigabit per second (Gb/s) or greater using integrated circuits with a transistor size of at least 0.1 micrometers (μm);
generating a first clock signal for a final multiplexer that generates the serialized signal;
generating a complementary clock signal based, at least in part, on the first clock signal;

detecting an error in phase between the first clock signal and the complementary clock signal; and generating a phase-shifted complementary clock signal based on the detected error in phase between the first clock signal and the complementary clock signal, wherein the final multiplexer uses the first clock signal and the phase-shifted complementary clock signal to generate the serialized signal with the data rate approximately 4 Gigabit per second (Gb/s) or greater.

2. The method of claim 1, wherein Silicon-on-Sapphire (SOS) executes the multiplexing.

3. The method of claim 1, further comprising:
identifying a number of the plurality of received digital signals;
determining a binary logarithm of the number of received digital signals to determine a number of multiplexing steps; and
successively multiplexing pairs of digital signals based, at least in part, on the plurality of received signals and in accordance with the determined number of multiplexing steps.

4. The method of claim 1, further comprising:
dynamically controlling an output of an oscillator in accordance with a phase locked loop; and
generating clock signals for each multiplexing step based, at least in part, on the controlled oscillator output.

5. The method of claim 3, further comprising:
passing the oscillator output to a final multiplexer as a clock signal and a frequency divider;
dividing a frequency of the oscillator output by a factor of two to generate a previous clock signal; and
passing the previous clock signal to a previous set of multiplexers.

6. The method of claim 1, further comprising passing the phase-corrected signals to d flip-flops in a multiplexer.

7. The method of claim 1, wherein multiplexing digital signals comprises multiplexing pairs of digital signals based, at least in part, on the received digital signals to generate a serialized signal.

8. The method of claim 1, wherein the plurality of digital signals comprises sixteen digital signals, further comprising successively multiplexing pairs of digital signals to generate a single serialized signal with a data rate at least about 5 Gb/s.

9. The method of claim 8, wherein each multiplexing step uses a 2:1 multiplexer.

10. A device, comprising:
a sapphire substrate;
an integrated circuited formed on the sapphire substrate and configured to receive a plurality of digital signals from a detector and successively multiplex the plurality of digital signals to generate a serialized signal with a data rate approximately 4 Gb/s or greater, the integrated circuit having a transistor size of at least 0.1 µm; and a phase-correction element coupled to a final multiplexer in the integrated circuit to detecting an error in phase between a first clock signal and a complementary clock signal and generating a phase-shifted complementary clock signal based on the detected error in phase between the first clock signal and the complementary clock signal, wherein the final multiplexer uses the first clock signal and the phase-shifted complementary clock signal to generate the serialized signal with the data rate approximately 4 Gigabit per second (Gb/s) or greater.

11. The device of claim 10, wherein the sapphire substrate is approximately 0.6 µm or thinner.

12. The device of claim 10, further comprising a plurality of 2:1 multiplexers selectively wired to successively multiplex pairs of digital signals based, at least in part, on the plurality of received signals.

13. The device of claim 10, further comprising a phase-locked loop configured to dynamically control an output of an oscillator in accordance with a phase difference between signals and generate clock signals for each multiplexing step based, at least in part, on the controlled oscillator output.

14. The device of claim 13, further comprising a plurality of frequency dividers selectively wired to generate a plurality of different clock signals used with each clock signal wired to a set of multiplexers.

15. The device of claim 10, wherein the integrated circuit includes d flip-flops to multiplex the plurality of digital signals.

16. The device of claim 10, wherein the integrated circuit comprises complementary metal-oxide-semiconductor (CMOS) technology.

17. The device of claim 10, wherein the multiplexing consumes approximately 150 milliWatts (mW) or less.

18. A device, comprising:
a sapphire substrate;
an integrated circuit formed on the sapphire substrate and configured to receive a plurality of digital signals from a detector and successively multiplex the plurality of digital signals to generate a serialized signal with a data rate approximately 5 Gb/s or greater, the integrated circuit including SOS CMOS technology with a feature size of approximately 0.25 µm; and
a phase-correction element coupled to a final multiplexer in the integrated circuit to detect an error in phase between a first clock signal and a complementary clock signal and generate a phase-shifted complementary clock signal based on the detected error in phase between the first clock signal and the complementary clock signal, wherein the final multiplexer uses the first clock signal and the phase-shifted complementary clock signal to generate the serialized signal with the data rate approximately 4 Gigabit per second (Gb/s) or greater.

* * * * *

UNITED STATES PATENT AND TRADEMARK OFFICE
CERTIFICATE OF CORRECTION

PATENT NO. : 8,624,761 B1
APPLICATION NO. : 12/768556
DATED : January 7, 2014
INVENTOR(S) : Datao Gong et al.

Page 1 of 1

It is certified that error appears in the above-identified patent and that said Letters Patent is hereby corrected as shown below:

In the Claims:

Column 7, Line 48, In Claim 10, delete "circuited" and insert -- circuit --, therefor.

Signed and Sealed this
Twenty-ninth Day of April, 2014

Michelle K. Lee
*Deputy Director of the United States Patent and Trademark Office*